(12) United States Patent
Yen et al.

(10) Patent No.: US 10,164,194 B2
(45) Date of Patent: Dec. 25, 2018

(54) COMPOUND FOR ORGANIC ELECTROLUMINESCENT DEVICE

(71) Applicant: LUMINESCENCE TECHNOLOGY CORPORATION, Hsin-Chu (TW)

(72) Inventors: Feng-Wen Yen, Taipei (TW); Cheng-Hao Chang, Miao-Li (TW)

( * ) Notice: Subject to any disclaimer, the term of this patent is extended or adjusted under 35 U.S.C. 154(b) by 85 days.

(21) Appl. No.: 14/604,754

(22) Filed: Jan. 26, 2015

(65) Prior Publication Data
US 2016/0218292 A1 Jul. 28, 2016

(51) Int. Cl.
*H01L 51/00* (2006.01)
*H01L 51/50* (2006.01)

(52) U.S. Cl.
CPC ...... *H01L 51/0056* (2013.01); *H01L 51/0058* (2013.01); *H01L 51/006* (2013.01); *H01L 51/0054* (2013.01); *H01L 51/0067* (2013.01); *H01L 51/0072* (2013.01); *H01L 51/0074* (2013.01); *H01L 51/0085* (2013.01); *H01L 51/5012* (2013.01); *H01L 51/5016* (2013.01); *H01L 51/5072* (2013.01)

(58) Field of Classification Search
CPC ............ H01L 51/0056; H01L 51/0058; H01L 51/5012; H01L 51/0074; H01L 51/0054; H01L 51/006; H01L 51/0085; H01L 51/0072; H01L 51/0067; H01L 51/5072; H01L 51/5016
See application file for complete search history.

(56) References Cited

U.S. PATENT DOCUMENTS

| | | | |
|---|---|---|---|
| 8,431,244 B2 * | 4/2013 | Ohrui | C07C 13/62 257/40 |
| 8,525,158 B2 * | 9/2013 | Shin | C07D 213/22 257/40 |
| 8,962,160 B2 * | 2/2015 | Yen | H01L 51/0058 257/40 |

(Continued)

FOREIGN PATENT DOCUMENTS

| CN | 103508835 | * | 1/2014 |
| CN | 103508835 A | | 1/2014 |

(Continued)

*Primary Examiner* — Kevin R Kruer

(57) ABSTRACT

The present invention discloses a compound is represented by the following formula (I), the organic EL device employing the compound as fluorescent host material, phosphorescent host material, can display good performance like as lower driving voltage and power consumption, increasing efficiency and half-life time.

formula(I)

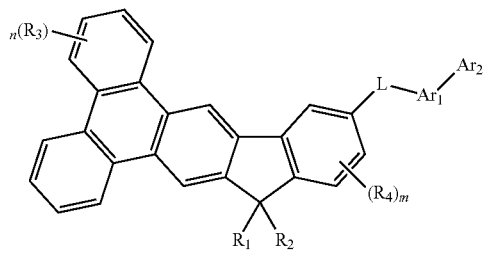

The same definition as described in the present invention.

8 Claims, 2 Drawing Sheets

— metal electrode
— electron injection layer
— electron transport layer
— hole blocking layer
— emitting layer
— hole transport layer
— hole injection layer
— transparent electrode

(56) References Cited

U.S. PATENT DOCUMENTS

| | | | |
|---|---|---|---|
| 8,993,130 B2* | 3/2015 | Yen | H01L 51/0058 257/40 |
| 9,040,174 B2* | 5/2015 | Yen | C07C 13/64 428/690 |
| 9,048,437 B2* | 6/2015 | Yen | H01L 51/0068 |
| 9,051,239 B2* | 6/2015 | Osaka | C07C 211/54 |
| 9,184,396 B2* | 11/2015 | Cheng | H01L 51/0061 |
| 9,260,363 B2* | 2/2016 | Yen | C07C 13/62 |
| 9,273,002 B2* | 3/2016 | Ito | C07D 213/22 |
| 2003/0071247 A1* | 4/2003 | Petrovskaia | C07D 311/94 252/582 |
| 2007/0247063 A1* | 10/2007 | Murase | C07D 209/86 313/504 |
| 2008/0160347 A1* | 7/2008 | Wang | C07C 13/66 428/704 |
| 2009/0096356 A1* | 4/2009 | Murase | C09K 11/06 313/504 |
| 2009/0284140 A1* | 11/2009 | Osaka | C07C 211/54 313/504 |
| 2010/0032658 A1* | 2/2010 | Lee | C09K 11/06 257/40 |
| 2010/0066241 A1* | 3/2010 | Cho | C09K 11/06 313/504 |
| 2010/0301744 A1* | 12/2010 | Osaka | C07C 211/54 313/504 |
| 2012/0001154 A1* | 1/2012 | Kato | C07D 209/82 257/40 |
| 2012/0001161 A1* | 1/2012 | Nakano | C09K 11/06 257/40 |
| 2012/0138907 A1* | 6/2012 | Murase | C07D 209/86 257/40 |
| 2013/0249968 A1* | 9/2013 | Yamada | C07C 13/62 345/690 |
| 2014/0001456 A1* | 1/2014 | Mizutani | C07D 405/14 257/40 |
| 2014/0131664 A1* | 5/2014 | Yen | C07C 13/62 257/40 |
| 2014/0151645 A1* | 6/2014 | Yen | C07C 13/64 257/40 |
| 2014/0166988 A1* | 6/2014 | Yen | H01L 51/0058 257/40 |
| 2014/0175383 A1* | 6/2014 | Yen | H01L 51/0058 257/40 |
| 2014/0175384 A1* | 6/2014 | Yen | H01L 51/0058 257/40 |
| 2014/0197392 A1* | 7/2014 | Horiuchi | C07D 409/10 257/40 |
| 2014/0209866 A1* | 7/2014 | Yen | H01L 51/0068 257/40 |
| 2014/0231754 A1 | 8/2014 | Yen | |
| 2014/0275530 A1* | 9/2014 | Jatsch | C07D 495/04 544/180 |
| 2014/0364625 A1* | 12/2014 | Ahn | H01L 51/0072 548/418 |
| 2014/0374717 A1* | 12/2014 | Kim | C07C 255/58 257/40 |
| 2015/0162533 A1* | 6/2015 | Itoi | H01L 51/006 257/40 |
| 2016/0072073 A1* | 3/2016 | Lee | C07D 405/14 257/40 |
| 2016/0218293 A1* | 7/2016 | Yen | H01L 51/0056 |
| 2016/0240784 A1* | 8/2016 | Yen | H01L 51/006 |

FOREIGN PATENT DOCUMENTS

| | | | |
|---|---|---|---|
| JP | 2013232520 A | | 11/2013 |
| KR | 10-2012-0072784 | * | 4/2012 |
| WO | 2013-009079 | * | 1/2013 |
| WO | 2015005559 | * | 1/2015 |

* cited by examiner

COMPOUND FOR ORGANIC ELECTROLUMINESCENT DEVICE

FIELD OF INVENTION

The present invention generally relates to a compound and organic electroluminescent (herein referred to as organic EL) device using the compound. More specifically, the present invention relates to the compound having general formula (I), an organic EL device employing the compound as fluorescent emitting host, phosphorescent emitting host.

BACKGROUND OF THE INVENTION

Organic electroluminescent (organic EL) is a light-emitting diode (LED) in which the emissive layer is a film made by organic compounds which emits light in response to an electric current. The emissive layer of organic compound is sandwiched between two electrodes. Organic EL is applied in flat panel displays due to their high illumination, low weight, ultra-thin profile, self-illumination without back light, low power consumption, wide viewing angle, high contrast, simple fabrication methods and rapid response time.

The first observation of electroluminescence in organic materials were in the early 1950s by Andre Bernanose and co-workers at the Nancy-University in France. Martin Pope and his co-workers at New York University first observed direct current (DC) electroluminescence on a single pure crystal of anthracene doped with tetracene under vacuum in 1963.

The first diode device was reported by Ching W. Tang and Steven Van Slyke at Eastman Kodak in 1987. The device used a two-layer structure with separate hole transporting and electron transporting layers resulted in reduction in operating voltage and improvement of the efficiency, that led to the current era of organic EL research and device production.

Typically organic EL device is composed of layers of organic materials situated between two electrodes, which include a hole transporting layer (HTL), an emitting layer (EML), an electron transporting layer (ETL). The basic mechanism of organic EL involves the injection of the carrier, transport, recombination of carriers and exciton formed to emit light. When an external voltage is applied to an organic EL device, electrons and holes are injected from a cathode and an anode, respectively, electrons will be injected from a cathode into a LUMO (lowest unoccupied molecular orbital) and holes will be injected from an anode into a HOMO (highest occupied molecular orbital). When the electrons recombine with holes in the emitting layer, excitons are formed and then emit light. When luminescent molecules absorb energy to achieve an excited state, an exciton may either be in a singlet state or a triplet state depending on how the spins of the electron and hole have been combined. 75% of the excitons form by recombination of electrons and holes to achieve a triplet excited state. Decay from triplet states is spin forbidden. Thus, a fluorescence electroluminescent device has only 25% internal quantum efficiency. In contrast to fluorescence electroluminescent device, phosphorescent organic EL device make use of spin-orbit interactions to facilitate intersystem crossing between singlet and triplet states, thus obtaining emission from both singlet and triplet states and the internal quantum efficiency of electroluminescent devices from 25% to 100%.

Recently, a new type of fluorescent organic EL device incorporating mechanism of thermally activated delayed fluorescence (TADF) has been developed by Adachi and coworkers is a promising way to obtain a high efficiency of exciton formation by converting spin-forbidden triplet excitons up to the siglet level by the mechanism of reverse intersystem crossing (RISC).

The organic EL utilizes both triplet and singlet excitons. Cause of longer lifetime and the diffusion length of triplet excitons compared to those of singlet excitons, the phosphorescent organic EL generally need an additional hole blocking layer (HBL) between the emitting layer (EML) and the electron transporting layer (ETL) or the electron transporting layer with hole blocking ability instead of typical ETL. The purpose of the use of HBL or HBETL is to confine the recombination of injected holes and electrons and the relaxation of created excitons within the EML, hence the device's efficiency can be improved. To meet such roles, the hole blocking materials must have HOMO (highest occupied molecular orbital) and LUMO (lowest unoccupied molecular orbital) energy levels suitable to block hole transport from the EML to the ETL and to pass electrons from the ETL to the EML, in addition, the good thermal and electrochemical stability of the phosphorescent emitting host material are also needed.

There continues to be a need for organic EL materials which is able to efficiently transport electrons or holes and block holes, with good thermal stability and more efficient EML material for high emitting efficiency. According to the reasons described above, the present invention has the objective of resolving such problems of the prior-art such as US20140131664A1, US20140175384A1 and US20140209866A1. The prior compounds used diaryl group linked to the position 12 of indenotriphenylene core. The present invention utilize a diaryl substituted arylene group linked to the position 13 of indenotriphenylene core and offering a light emitting device which is excellent in its thermal stability, high luminance efficiency, high luminance and long half-life time than the prior materials.

SUMMARY OF THE INVENTION

Provided a compound can use as fluorescent emitting host, phosphorescent emitting host, for organic EL device. The compound can overcome the drawbacks of the prior materials such as US20140131664A1, US20140175384A1 and US20140209866A1 like as lower efficiency, half-life-time and higher power consumption.

An object of the present invention is to provide the compound which can be used as fluorescent emitting host, phosphorescent emitting host for organic EL device.

The present invention has the economic advantages for industrial practice. Accordingly the present invention, the compound which can be used for organic EL device is disclosed. The mentioned the compound is represented by the following formula (I)

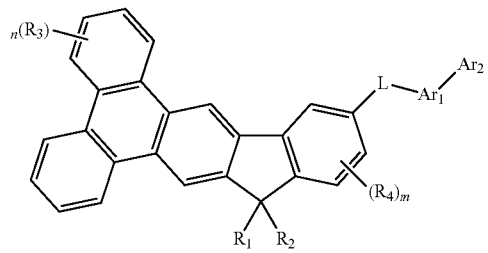

formula(I)

Wherein L represent a single bond, a substituted or unsubstituted divalent arylene group having 6 to 30 ring carbon atoms. $Ar_1$, $Ar_2$ independently selected from the group consisting of a substituted or unsubstituted phenyl group, a substituted or unsubstituted naphthyl group, a substituted or unsubstituted anthracenyl group, a substituted or unsubstituted phenanthrenyl group, a substituted or unsubstituted pyrenyl group, a substituted or unsubstituted chrysenyl group. m represent an integer of 0 to 3. n represent an integer of 0 to 10. $R_1$ to $R_4$ independently selected from the group consisting of a hydrogen atom, a substituted or unsubstituted alkyl group having 1 to 20 carbon atoms, a substituted or unsubstituted aryl group having 6 to 30 carbon atoms, a substituted or unsubstituted aralkyl group having 6 to 30 carbon atoms, a substituted or unsubstituted heteroaryl group having 3 to 30 carbon atoms.

DESCRIPTION OF THE PREFERRED EMBODIMENTS

Figure 1:
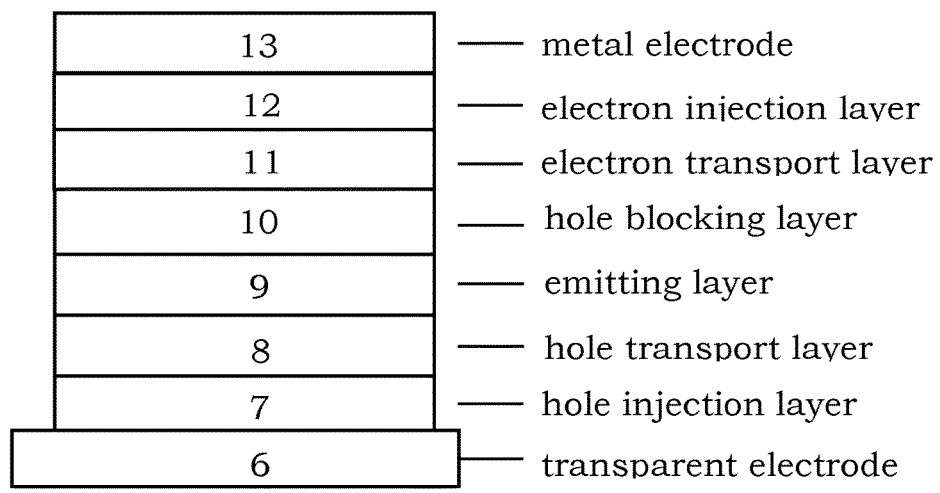
FIG. 1 show one example of organic EL device in the present invention. 6 is transparent electrode, 13 is metal electrode, 7 is hole injection layer which is deposited onto 6, 8 is hole transport layer which is deposited onto 7, 9 is fluorescent or phosphorescent emitting layer which is deposited onto 8, 10 is hole blocking layer which is deposited onto 9, 11 is electron transport layer which is deposited onto 10, 12 is electron injection layer which is deposited on to 11.
Figure 2:
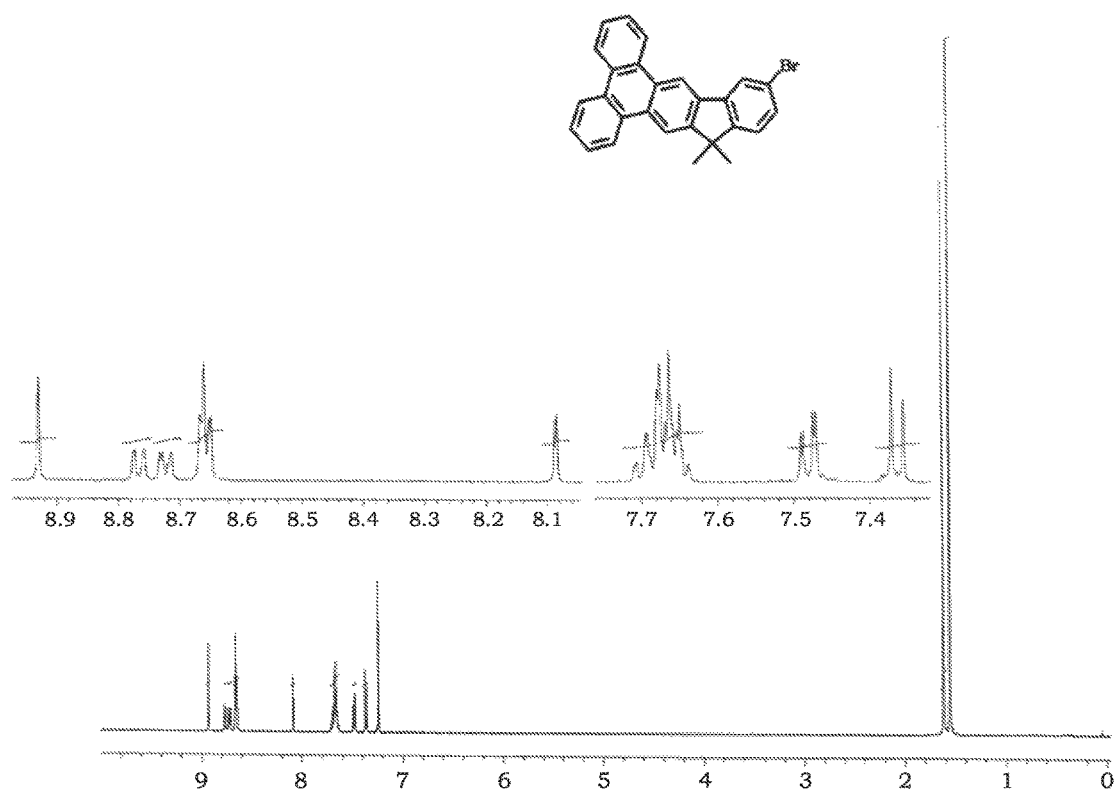
FIG. 2 show the $^1$H NMR spectrogram of Intermediate I which is important synthetic intermediate of the position 13 of indenotriphenylene skeleton for the present invention formula (I).

What probed into the invention is the compound and organic EL device using the compound. Detailed descriptions of the production, structure and elements will be provided in the following to make the invention thoroughly understood. Obviously, the application of the invention is not confined to specific details familiar to those who are skilled in the art. On the other hand, the common elements and procedures that are known to everyone are not described in details to avoid unnecessary limits of the invention. Some preferred embodiments of the present invention will now be described in greater detail in the following. However, it should be recognized that the present invention can be practiced in a wide range of other embodiments besides those explicitly described, that is, this invention can also be applied extensively to other embodiments, and the scope of the present invention is expressly not limited except as specified in the accompanying claims.

In a first embodiment of the present invention, the compound which can be used as fluorescent emitting host, phosphorescent emitting host for organic EL device are disclosed. The mentioned material are represented by the following formula (I)

formula(I)

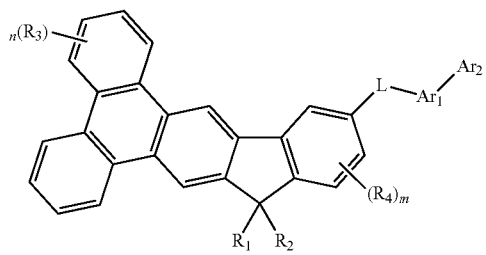

Wherein L represent a single bond, a substituted or unsubstituted divalent arylene group having 6 to 30 ring carbon atoms. $Ar_1$, $Ar_2$ independently selected from the group consisting of a substituted or unsubstituted phenyl group, a substituted or unsubstituted naphthyl group, a substituted or unsubstituted anthracenyl group, a substituted or unsubstituted phenanthrenyl group, a substituted or unsubstituted pyrenyl group, a substituted or unsubstituted chrysenyl group. m represent an integer of 0 to 3. n represent an integer of 0 to 10. $R_1$ to $R_4$ independently selected from the group consisting of a hydrogen atom, a substituted or unsubstituted alkyl group having 1 to 20 carbon atoms, a substituted or unsubstituted aryl group having 6 to 30 carbon atoms, a substituted or unsubstituted aralkyl group having 6 to 30 carbon atoms, a substituted or unsubstituted heteroaryl group having 3 to 30 carbon atoms.

According to the above-mentioned formula (I) wherein L is represented the following:

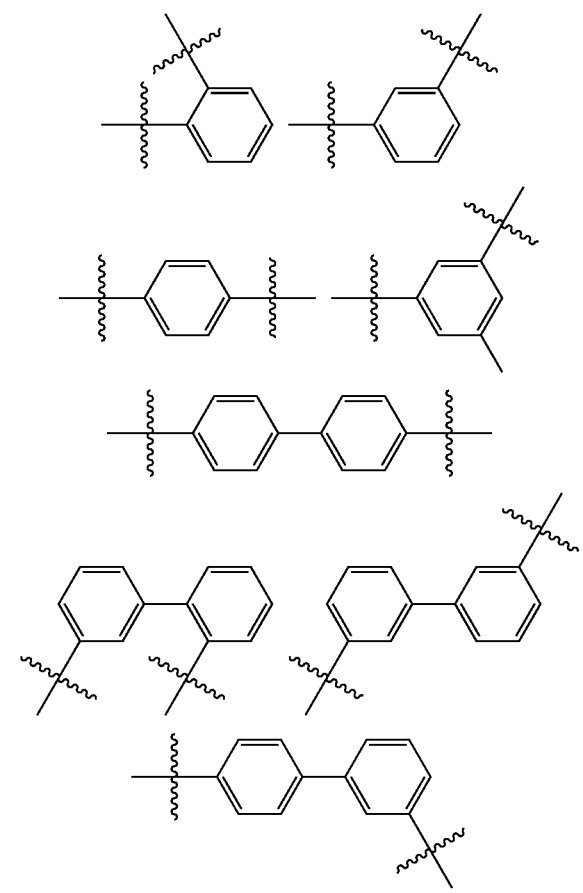

According to the above-mentioned formula (I) wherein $Ar_1$ is represented the following:

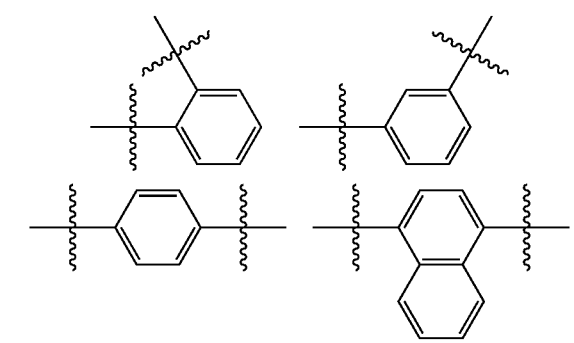

-continued
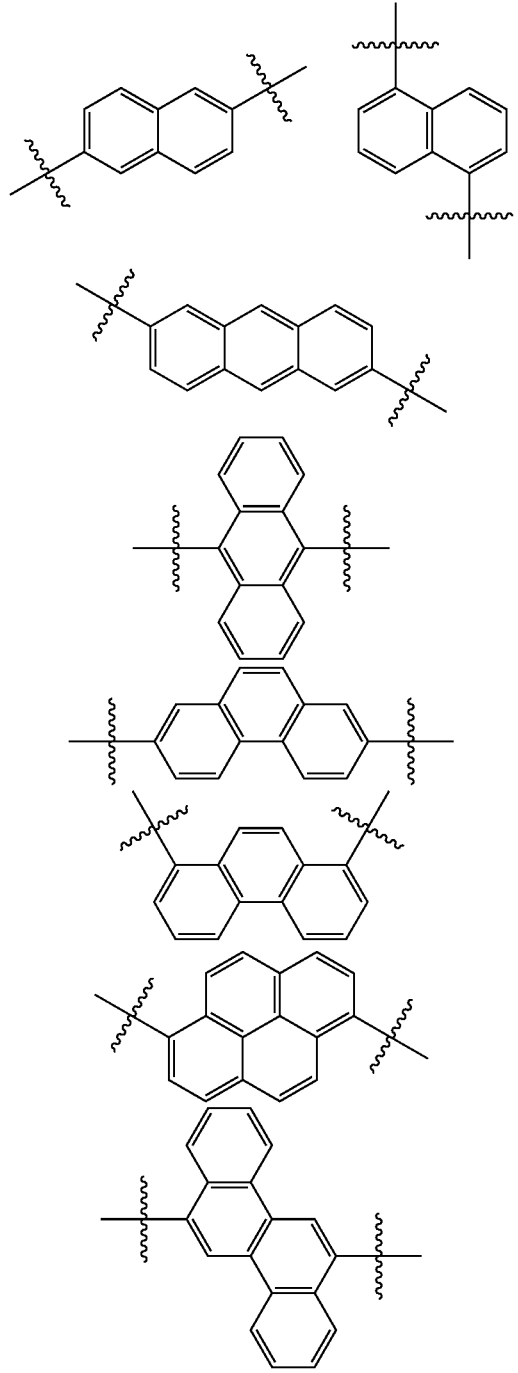
According to the above-mentioned formula (I) wherein Ar$_2$ is represented the following:
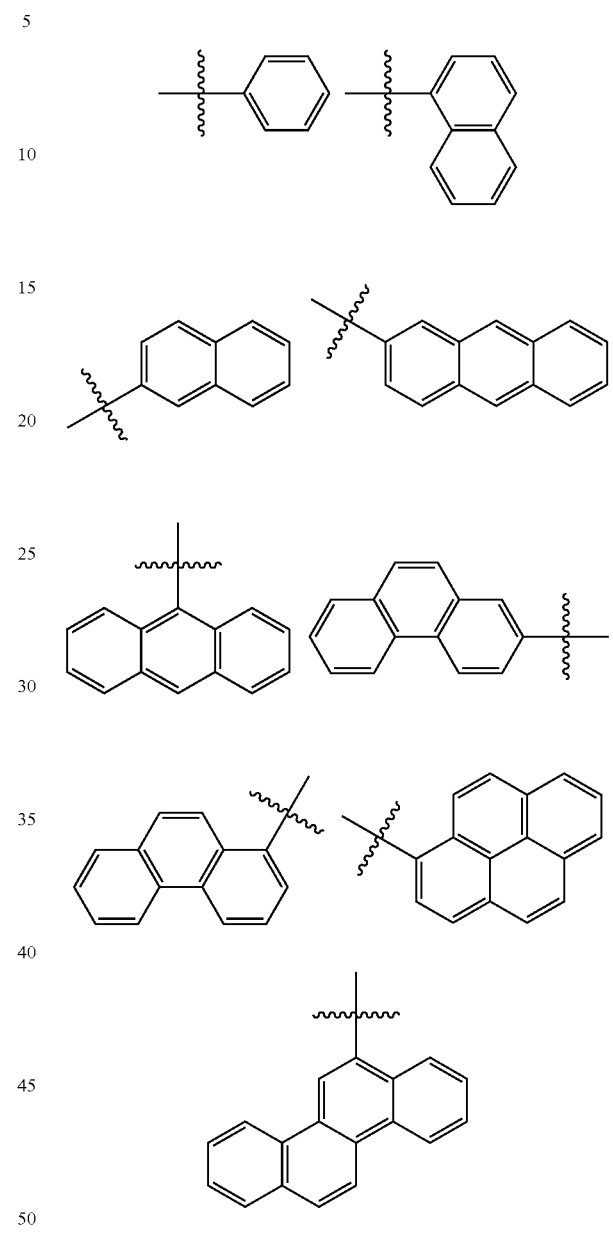
In this embodiment, some materials are shown below:
A1
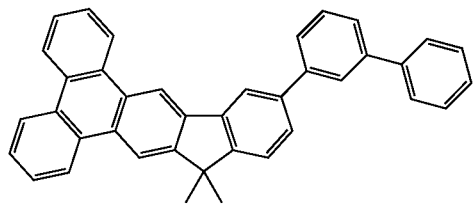
A2
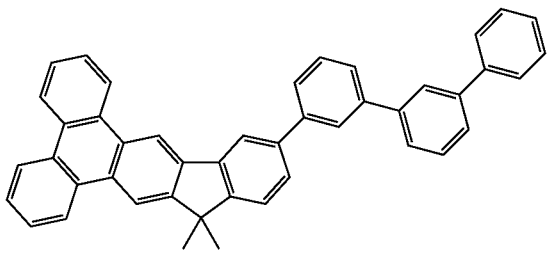

-continued
A3
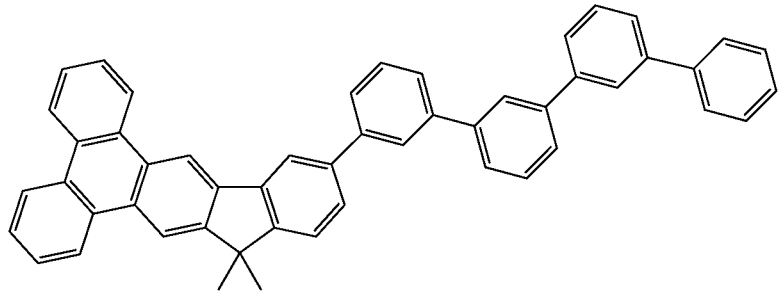
A4
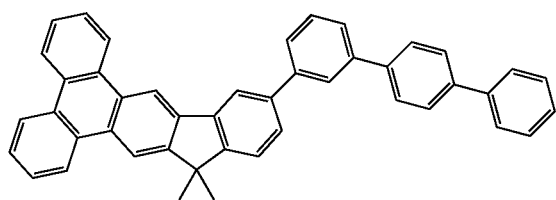
A5
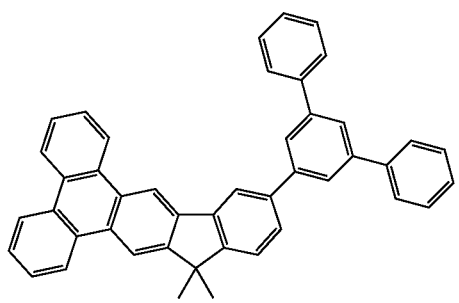
A6
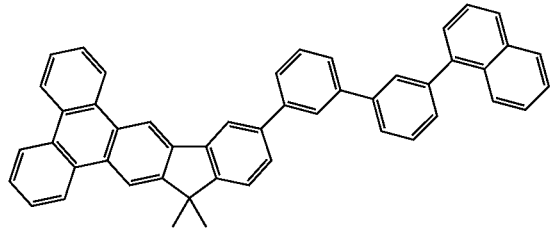
A7
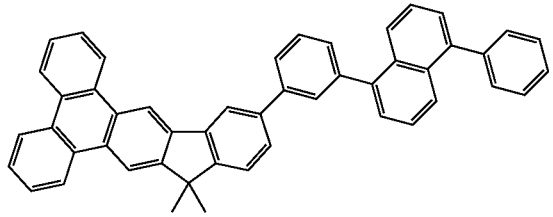
A8
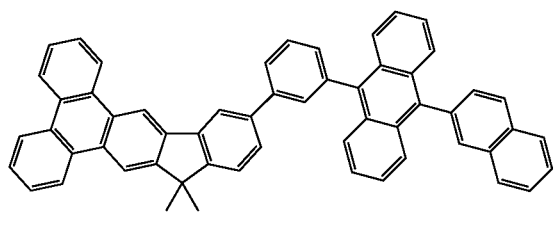
A9
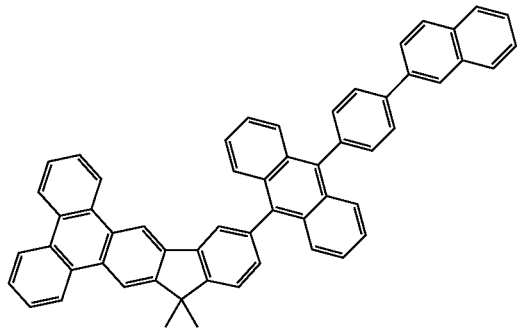
A10
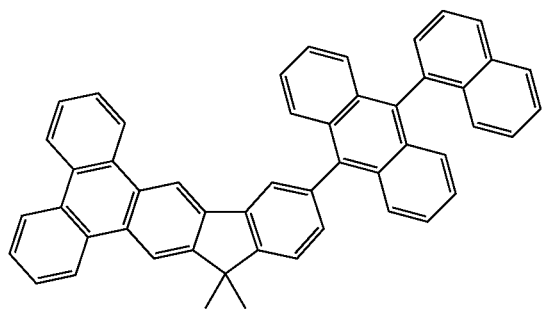
A11
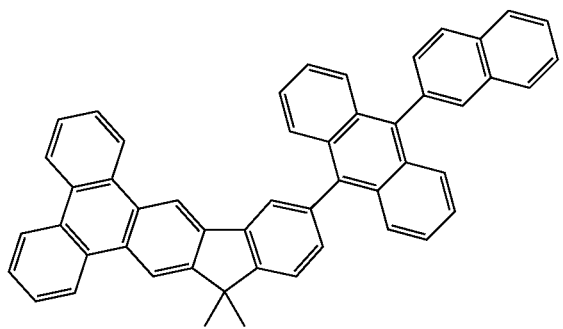

-continued
A12
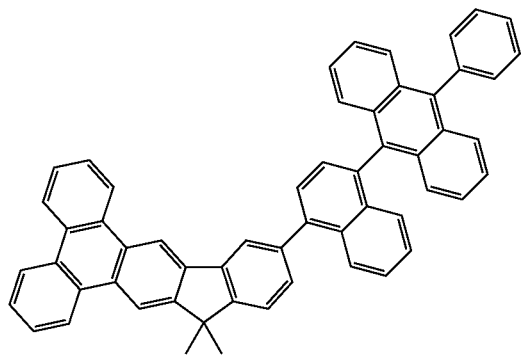
A13
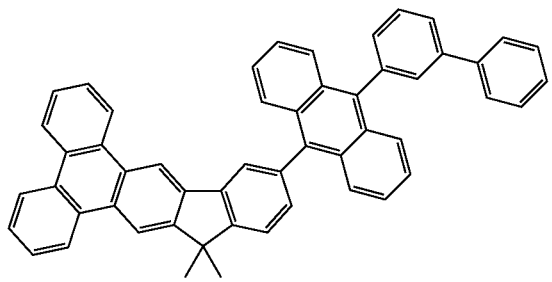
A14
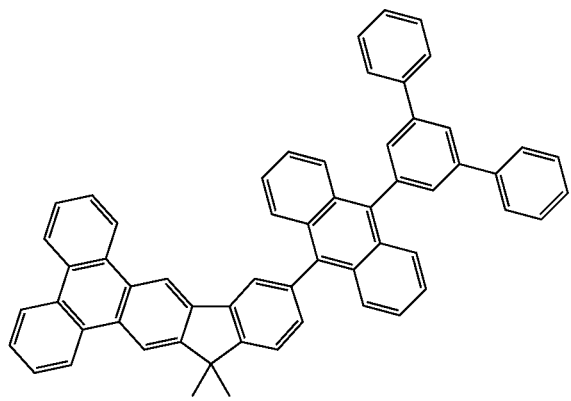
A15
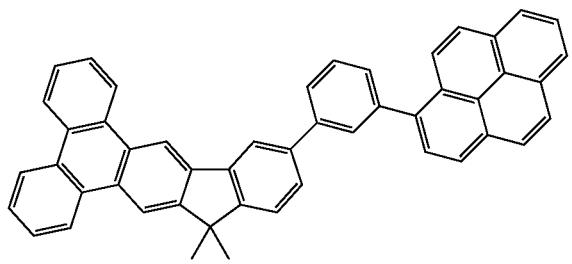
A16
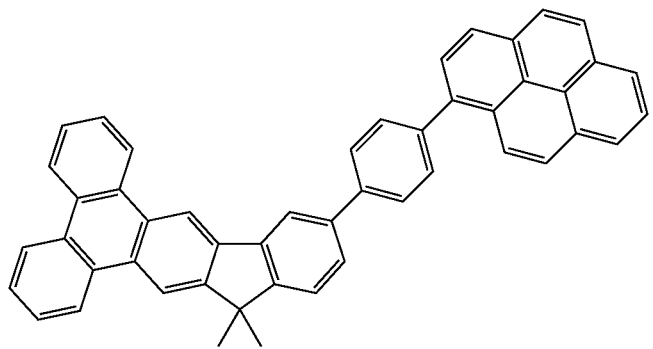
A17
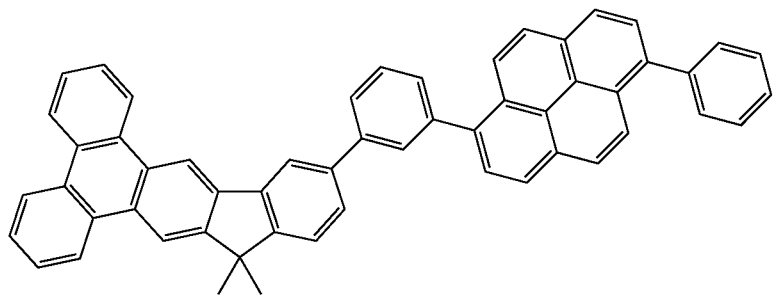

-continued
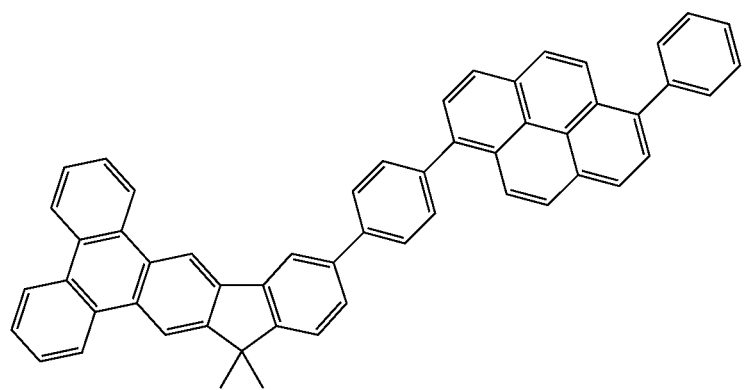
A18
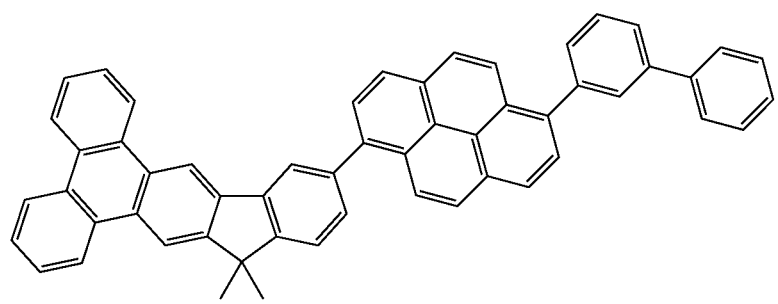
A19
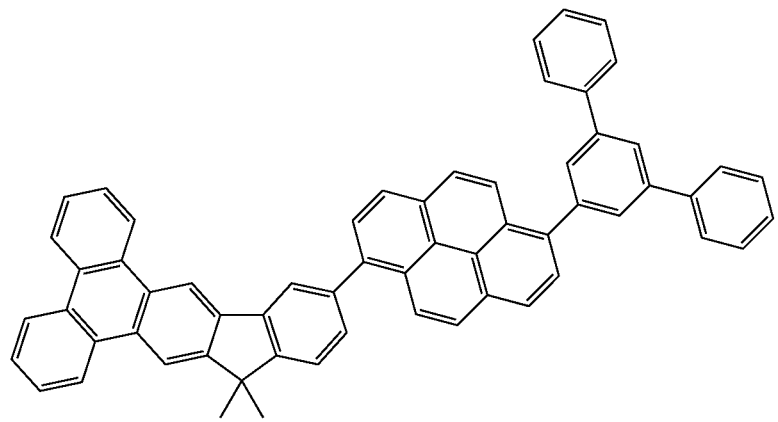
A20
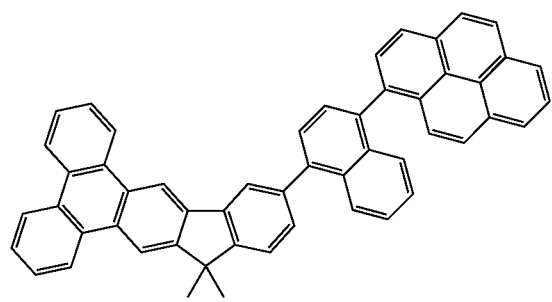
A21
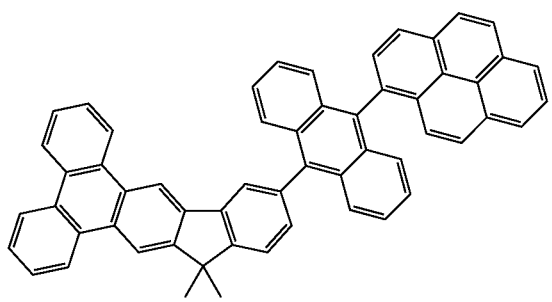
A22

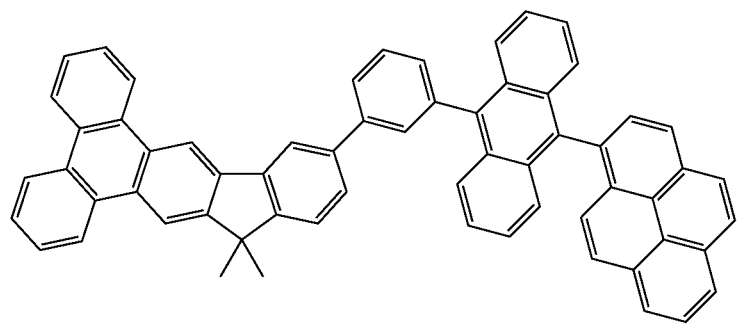

A23

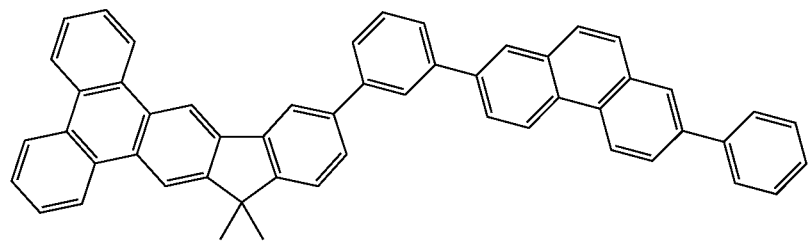

A24

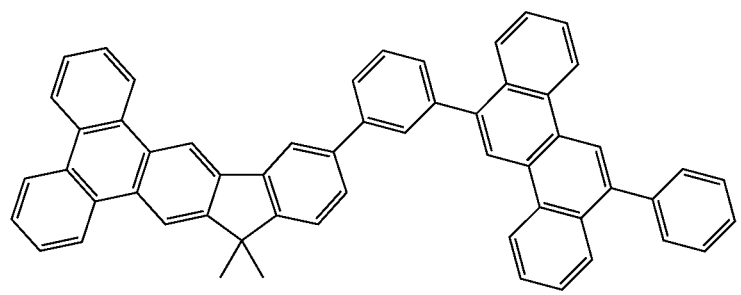

A25

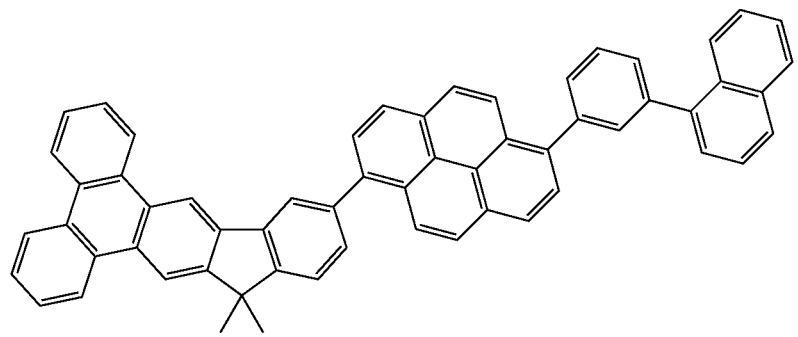

A26

Detailed preparation for the compound in the present invention could be clarified by exemplary embodiments, but the present invention is not limited to exemplary embodiments. EXAMPLE 1~6 show the preparation for some EXAMPLES of the compound in the present invention. EXAMPLE 7~8 show the fabrication of organic EL device and I-V-B, half-life time of organic EL device testing report.

Example 1

Synthesis of 2-(biphenyl-2-yl)-6-bromo-9,9-dimethyl-9H-fluorene

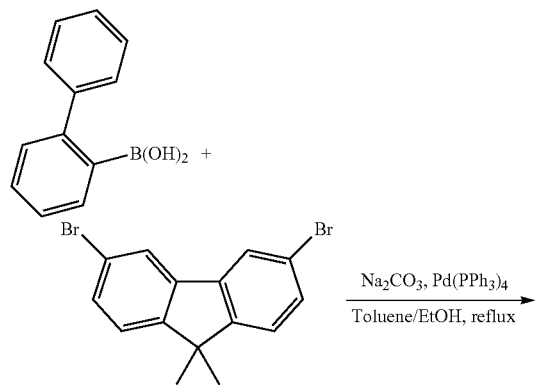

A mixture of 35.2 g (100 mmol) of 3,6-dibromo-9,9-dimethyl-9H-fluorene, 21.8 g (110 mmol) of biphenyl-2-ylboronic acid, 2.31 g (2 mmol) of Pd(PPh$_3$)$_4$, 75 ml of 2M Na$_2$CO$_3$, 150 ml of EtOH and 300 ml toluene was degassed and placed under nitrogen, and then heated at 100° C. for 12 h. After finishing the reaction, the mixture was allowed to cool to room temperature. The organic layer was extracted with ethyl acetate and water, dried with anhydrous magnesium sulfate, the solvent was removed and the residue was purified by column chromatography on silica to give product (26.8 g, 63.0 mmol, 63%) as a white solid.

Synthesis of 13-bromo-10,10-dimethyl-10H-indeno[2,1-b]triphenylene (Intermediate I)

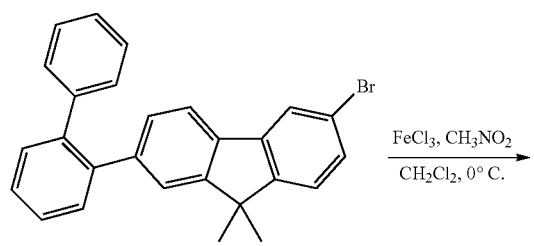

Intermediate I

In a 3000 ml three-necked flask that had been degassed and filled with nitrogen, 26.8 g (60 mmol) of 2-(biphenyl-2-yl)-7-bromo-9,9-Dimethyl-9H-fluorene was dissolved in anhydrous dichloromethane (1500 ml), 97.5 g (600 mmol) iron (III) chloride was then added, and the mixture was stirred one hour. Methanol 500 ml were added to the mixture and the organic layer was separated and the solvent removed in vacuo. The residue was purified by column chromatography on silica (hexane-dichloromethane) afforded a white solid (10.7 g, 25.3 mmol, 40%). $^1$H NMR (CDCl$_3$, 500 MHz): chemical shift (ppm) 8.93 (s, 1H), 8.77~8.71 (m, 2H), 8.67~8.65 (m, 3H), 8.08 (d, J=1.5 Hz, 1H), 7.71~7.64 (m, 4H), 7.49 (dd, J$_1$=8.5 Hz, J$_2$=1.5 Hz, 1H), 7.37 (d, J=8.5 Hz, 1H), 1.62 (s, 6H).

Synthesis of 2-(biphenyl-3-yl)-4,4,5,5-tetramethyl-1,3,2-dioxaborolane

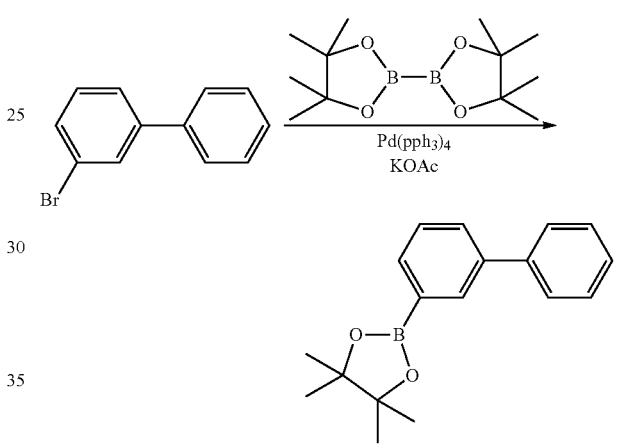

A mixture of 14.4 g (61.9 mmol) of 3-bromobiphenyl, 19 g (75 mmol) of bis(pinacolato)diboron, 1.4 (1.2 mmol) of tetrakis(triphenylphosphine)palladium, 9.1 g (93 mmol) of potassium acetate, and 450 ml of 1,4-dioxane was degassed and placed under nitrogen, and then heated at 90° C. for 24 hours. After finishing the reaction, the mixture was allowed to cool to room temperature. The organic layer was extracted with ethyl acetate and water, dried with anhydrous magnesium sulfate, the solvent was removed and the product was purified by column using a mixture of hexanes and ethyl acetate as eluent to get 11.8 g of light white product (yield 68%).

Synthesis of 13-(biphenyl-3-yl)-10,10-dimethyl-10H-indeno[1,2-b]triphenylene

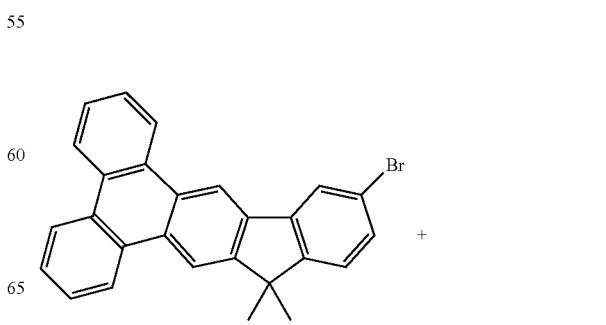

+

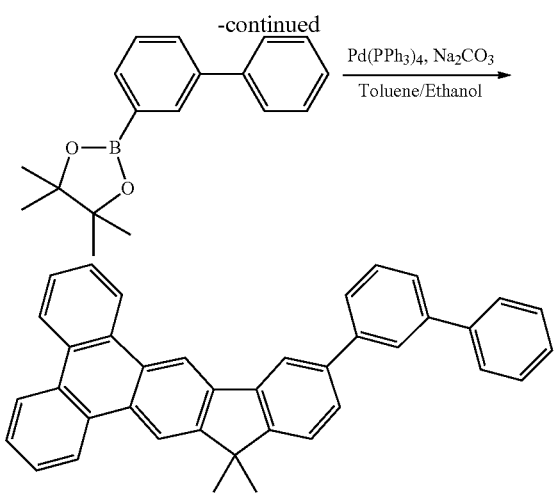

A mixture of 4.28 g (10.1 mmol) of intermediate I, 3.4 g (12 mmol) of 2-(biphenyl-3-yl)-4,4,5,5-tetramethyl-1,3,2-dioxaborolane, 0.22 g (0.2 mmol) of tetrakis(triphenylphosphine)palladium, 15 ml of 2M $Na_2CO_3$, 20 ml of EtOH and 40 ml toluene was degassed and placed under nitrogen, and then heated at 90° C. overnight. After finishing the reaction, the mixture was allowed to cool to room temperature. The solution was extracted with 100 mL of ethyl acetate and 500 ml of water. The organic layer was dried with anhydrous magnesium sulfate and the solvent was evaporated under reduced pressure. The residue was purified by column chromatography on silica (Hx~$CH_2Cl_2$) to give product 2.7 g (54%). MS (m/z, FAB+): 496.3; $^1$H NMR (CDCl$_3$, 500 MHz): chemical shift (ppm) 9.09 (s, 1H), 8.85~8.75 (m, 2H), 8.73 (s, 1H), 8.68~8.66 (d, J=8.5 Hz, 2H), 8.13~7.84 (m, 6H), 7.78~7.63 (m, 4H), 7.56~7.48 (m, 6H), 1.72 (s, 6H).

Example 2

Synthesis of 4,4,5,5-tetramethyl-2-(3'-phenylbiphenyl-3-yl)-1,3,2-dioxaborolane

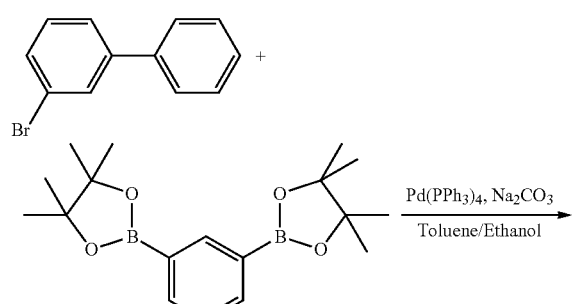

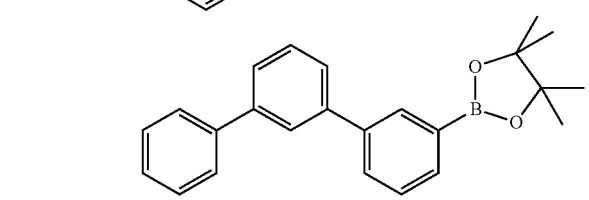

A mixture of 8.3 g (25 mmol) of 1,3-bis(4,4,5,5-tetramethyl-1,3,2-dioxaborolan-2-yl)benzene, 5.8 g (25 mmol) of 3-bromobiphenyl, 0.6 g (0.5 mmol) of tetrakis(triphenylphosphine)palladium, 20 ml of 2M $Na_2CO_3$, 20 ml of EtOH and 50 ml toluene was degassed and placed under nitrogen, and then heated at 75° C. overnight. After finishing the reaction, the mixture was allowed to cool to room temperature. The reaction mixture was extracted with ethyl acetate and water, dried with anhydrous magnesium sulfate, the solvent was evaporated in vacuum. The residue was purified by column using a mixture of hexanes and ethyl acetate as eluent to get 3.8 g of light white product (yield 43%).

Example 2

Synthesis of 10,10-dimethyl-13-(3'-phenylbiphenyl-3-yl)-10H-indeno[1,2-b]triphenylene

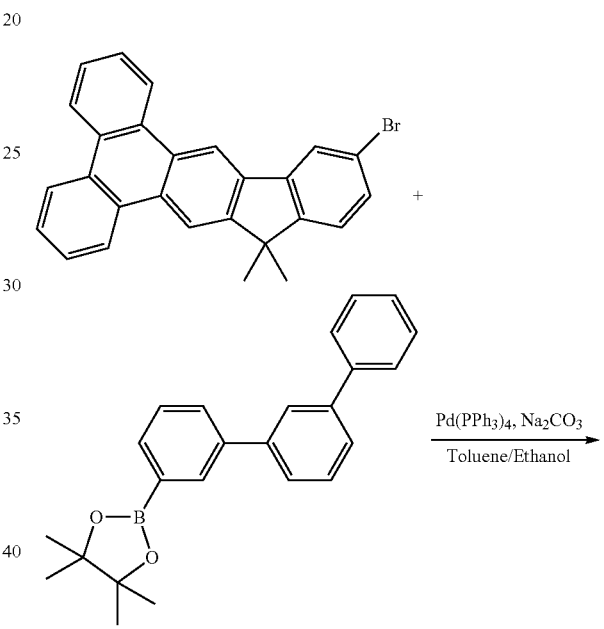

4,4,5,5-tetramethyl-2-(3'-phenylbiphenyl-3-yl)-1,3,2-dioxa borolane instead of 2-(biphenyl-3-yl)-4,4,5,5-tetramethyl-1,3,2-dioxa borolane, except for using the same method as in synthesis example 1, the desired compound of example 2 (3.3 g, yield-54%) was obtained. MS (m/z, FAB+): 572.3; $^1$H NMR (CDCl$_3$, 500 MHz): chemical shift (ppm) 9.03 (s, 1H), 8.87~8.78 (m, 2H), 8.75 (s, 1H), 8.71~8.69 (d, J=8.5 Hz, 2H), 8.15~7.84 (m, 7H), 7.81~7.61 (m, 5H), 7.55~7.38 (m, 8H), 1.75 (s, 6H).

Example 3

Synthesis of 4,4,5,5-tetramethyl-2-(3-(pyren-1-yl)phenyl)-1,3,2-dioxaborolane

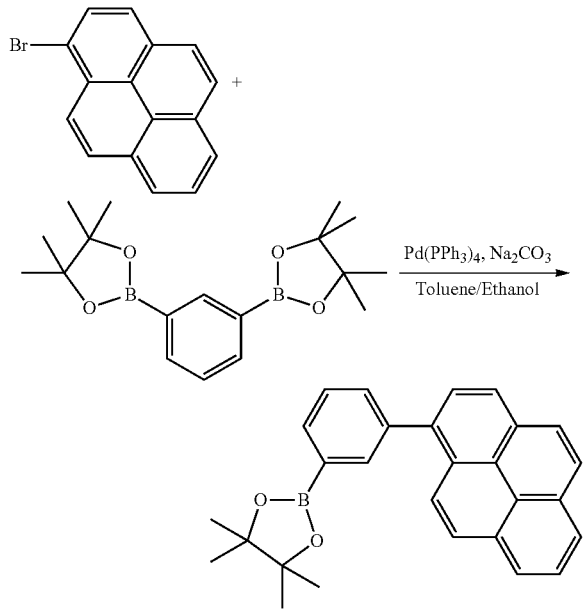

A mixture of 8.3 g (25 mmol) of 1,3-bis(4,4,5,5-tetramethyl-1,3,2-dioxaborolan-2-yl)benzene, 7 g (25 mmol) of 1-bromopyrene, 0.6 g (0.5 mmol) of tetrakis(triphenylphosphine)palladium, 20 ml of 2M $Na_2CO_3$, 20 ml of EtOH and 50 ml toluene was degassed and placed under nitrogen, and then heated at 75° C. overnight. After finishing the reaction, the mixture was allowed to cool to room temperature. The reaction mixture was extracted with ethyl acetate and water, dried with anhydrous magnesium sulfate, the solvent was evaporated in vacuum. The residue was purified by column using a mixture of hexanes and ethyl acetate as eluent to get 3.7 g of white product (yield 37%).

Synthesis of 10,10-dimethyl-13-(3-(pyren-1-yl)phenyl)-10H-indeno[1,2-b]triphenylene

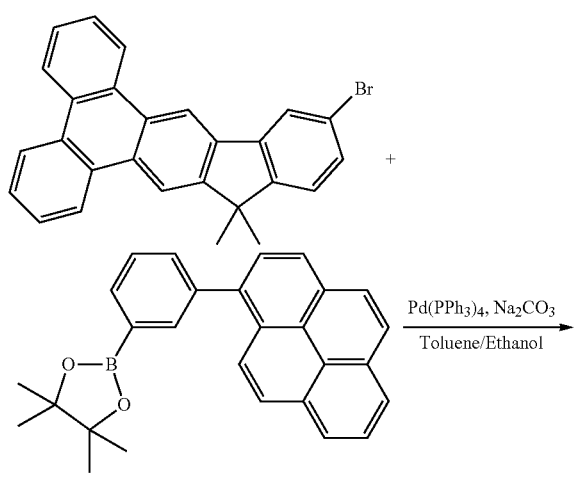

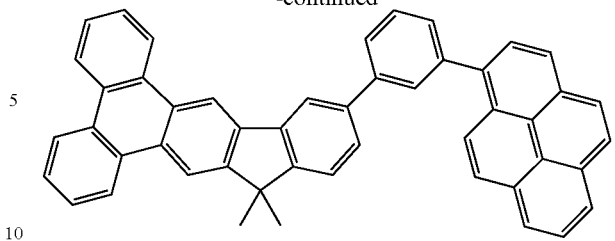

A mixture of 3.4 g (8 mmol) of intermediate I, 3.7 g (9.1 mmol) of 4,4,5,5-tetramethyl-2-(3-(pyren-1-yl)phenyl)-1,3,2-dioxaborolane, 0.2 g (0.17 mmol) of tetrakis(triphenylphosphine)palladium, 15 ml of 2M $Na_2CO_3$, 20 ml of EtOH and 40 ml toluene was degassed and placed under nitrogen, and then heated at 90° C. overnight. After finishing the reaction, the mixture was allowed to cool to room temperature. The solution was extracted with 100 mL of ethyl acetate and 500 ml of water. The organic layer was dried with anhydrous magnesium sulfate and the solvent was evaporated under reduced pressure. The residue was purified by column chromatography on silica (Hx~$CH_2Cl_2$) to give product 3.1 g (63%). MS (m/z, FAB+): 620.8; [1] NMR $CDCl_3$, 500 MHz): chemical shift (ppm) 9.09 (s, 1H), 8.85~8.84 (d, 1H), 8.78~8.76 (d, 1H), 8.71 (s, 1H), 8.69~8.65 (d, J=8.5 Hz, 2H), 8.27~8.19 (m, 5H), 8.12~8.00 (m, 5H), 7.93~7.92 (dd, J=8.5 Hz, 2H), 7.84~7.61 (m, 8H) 1.73 (s, 6H).

Example 4

Synthesis of 10,10-dimethyl-13-(4-(pyren-1-yl)phenyl)-10H-indeno[1,2-b]triphenylene

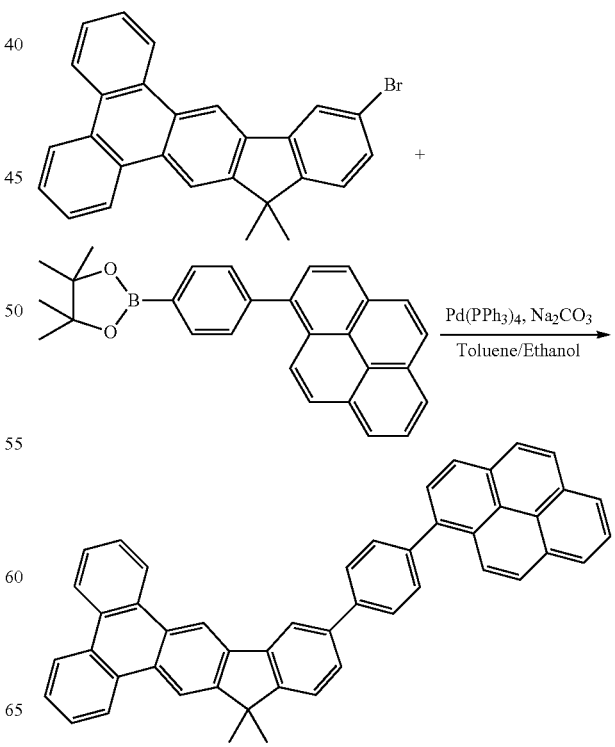

4,4,5,5-tetramethyl-2-(4-(pyren-1-yl)phenyl)-1,3,2-dioxaborolane instead of 4,4,5,5-tetramethyl-2-(3-(pyren-1-yl)phenyl)-1,3,2-dioxaborolane, except for using the same method as in synthesis example 3, the desired compound of example 4 (2.2 g, yield=31%) was obtained. MS (m/z, FAB+): 620.8; 1H NMR (CDCl₃, 500 MHz): chemical shift (ppm) 9.09 (s, 1H), 8.86~8.84 (d, 1H), 8.79~8.76 (d, 1H), 8.72 (s, 1H), 8.69~8.66 (d, J=8.5 Hz, 2H), 8.31~8.17 (m, 5H), 8.13~8.00 (m, 5H), 7.95~7.93 (dd, J=8.5 Hz, 2H), 7.79~7.63 (m, 8H) 1.73 (s, 6H).

Example 5

Synthesis of 4,4,5,5-tetramethyl-2-(3-(10-(naphthalen-2-yl)anthracen-9-yl)phenyl)-1,3,2-dioxaborolane

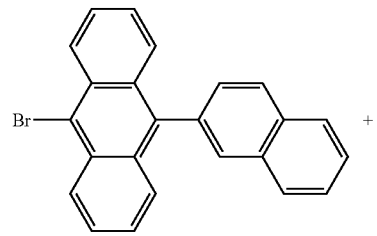

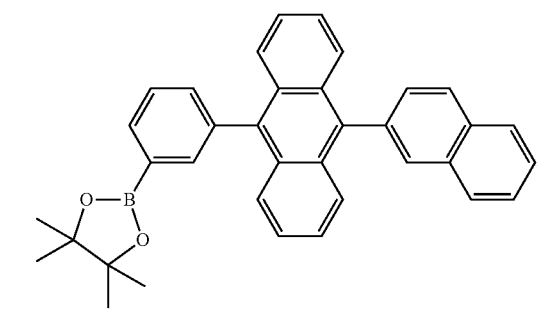

A mixture of 8.3 g (25 mmol) of 1,3-bis(4,4,5,5-tetramethyl-1,3,2-dioxaborolan-2-yl)benzene, 9.6 g (25 mmol) of 9-bromo-10-(naphthalen-2-yl)anthracene, 0.6 g (0.5 mmol) of tetrakis (triphenylphosphine)palladium, 20 ml of 2M Na₂CO₃, 20 ml of EtOH and 50 ml toluene was degassed and placed under nitrogen, and then heated at 75° C. overnight. After finishing the reaction, the mixture was allowed to cool to room temperature. The reaction mixture was extracted with ethyl acetate and water, dried with anhydrous magnesium sulfate, the solvent was evaporated in vacuum. The residue was purified by column using a mixture of hexanes and ethyl acetate as eluent to get 4.0 g of yellow product (yield 32%).

Synthesis of 10,10-dimethyl-13-(3-(10-(naphthalen-2-yl)anthracen-9-yl)phenyl)-10H-indeno[1,2-b]triphenylene

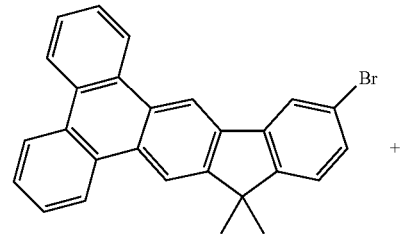

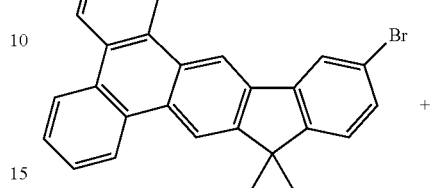

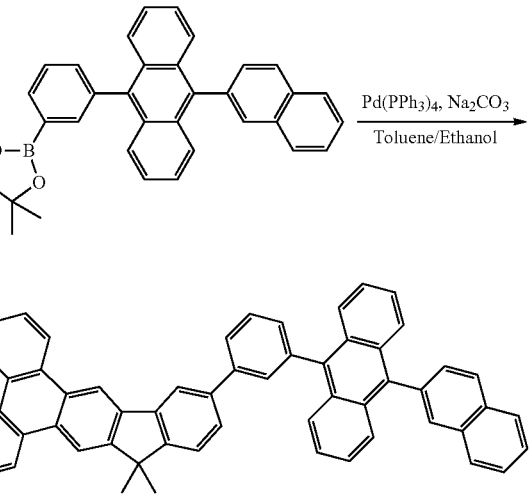

4,4,5,5-tetramethyl-2-(3-(10-(naphthalen-2-yl)anthracen-9-yl)phenyl)-1,3,2-dioxaborolane of 4,4,5,5-tetramethyl-2-(3-(pyren-1-yl)phenyl)-1,3,2-dioxaborolane, except for using the same method as in synthesis example 3, the desired compound of example 5 (3.3 g, yield-47%) was obtained. MS (m/z, FAB+): 722.5; ¹H NMR (CDCl₃, 500 MHz): chemical shift (ppm) 9.03 (s, 1H), 8.82~8.79 (d, 1H), 8.76~8.73 (d, 1H), 8.71 (s, 1H), 8.68~8.64 (d, J=8.5 Hz, 2H), 8.31~8.17 (m, 5H), 8.13~7.91 (m, 7H), 7.85~7.63 (m, 10H), 7.51~7.47 (m, 4H) 1.73 (s, 6H).

Example 6

Synthesis of 10,10-dimethyl-13-(10-(naphthalen-1-yl)anthracen-9-yl)-10H-indeno[1,2-b]triphenylene

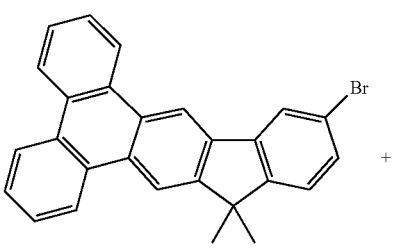

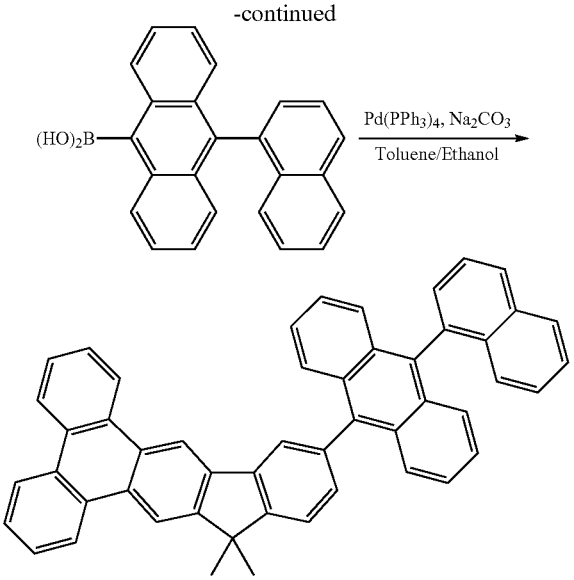

10-(naphthalen-1-yl)anthracen-9-ylboronic acid instead of 4,4,5,5-tetramethyl-2-(3-(pyren-1-yl)phenyl)-1,3,2-dioxaborolane, except for using the same method as in synthesis example 3, the desired compound of example 6 (4.8 g, yield=69%) was obtained. MS (m/z, FAB+): 646.3; $^1$H NMR (CDCl$_3$, 500 MHz): chemical shift (ppm) 9.04 (s, 1H), 8.84~8.81 (d, 1H), 8.79~8.76 (d, 1H), 8.73 (s, 1H), 8.67~8.64 (d, J=8.5 Hz, 2H), 8.31~8.17 (m, 5H), 8.13~7.91 (m, 7H), 7.85~7.63 (m, 8H), 7.51~7.47 (m, 2H) 1.71 (s, 6H).

General Method of Producing Organic EL Device

ITO-coated glasses with 9~12 ohm/square in resistance and 120~160 nm in thickness are provided (hereinafter ITO substrate) and cleaned in a number of cleaning steps in an ultrasonic bath (e.g. detergent, deionized water). Before vapor deposition of the organic layers, cleaned ITO substrates are further treated by UV and ozone. All pre-treatment processes for ITO substrate are under clean room (class 100).

These organic layers are applied onto the ITO substrate in order by vapor deposition in a high-vacuum unit (10$^{-7}$ Torr), such as: resistively heated quartz boats. The thickness of the respective layer and the vapor deposition rate (0.1~0.3 nm/sec) are precisely monitored or set with the aid of a quartz-crystal monitor. It is also possible, as described above, for individual layers to consist of more than one compound, i.e. in general a host material doped with a dopant material. This is achieved by co-vaporization from two or more sources.

Dipyrazino[2,3-f:2,3-]quinoxaline-2,3,6,7,10,11-hexacarbonitrile (HAT-CN) is used as hole injection layer in this organic EL device. N,N-Bis(naphthalene-1-yl)-N,N-bis(phenyl)-benzidine (NPB) is most widely used as the hole transporting layer. 10,10-Dimethyl-12-(4-(pyren-1-yl)phenyl)-10H-indeno[1,2-b]triphenylene(PT-312, US20140175384) or 10,10-dimethyl-12-(10-(naphthalen-2-yl)anthracen-9-yl)-10H-indeno[2,1-b]triphenylene (PT-3 13, US2040209866) is used as blue emitting host in organic EL device for comparison and N1,N1,N6,N6-tetram-tolylpyrene-1,6-diamine (D1) is used as blue guest. 2-(10,10-dimethyl-10H-indeno[2,1-b]triphenylen-13-yl)-9-phenyl-1,10-phenanthroline is used as electron transporting material (ET1) to co-deposit with 5% Li, 2-(10,10-dimethyl-10H-indeno[2,1-b]triphenylen-12-yl)-4,6-diphenyl-1,3,5-triazine (ET2), 2-(10,10-dimethyl-10H-indeno[2,1-b]triphenylen-13-yl)-4,6-bis 5-phenylbiphenyl-3-yl)-1,3,5-triazineto (ET3) or 2,9-di(naphthalen-2-yl)-4,7-diphenyl-1,10-phenanthroline (ET4) is used as electron transporting material to co-deposit with 8-hydroxyquinolato-lithium (LiQ) in organic EL device for comparison. Tris(2-phenylpyridinato)iridium(III) (D2) is used as phosphorescent dopant. 4-(10,10-dimethyl-10H-indeno[2,1-b]triphenylen-13-yl)dibenzo[b,d]thiophene (H1) is used as hole blocking material in organic phosphorescent EL device. The prior art of OLED materials for producing standard organic EL device control and comparable material in this invention shown its chemical structure as following:

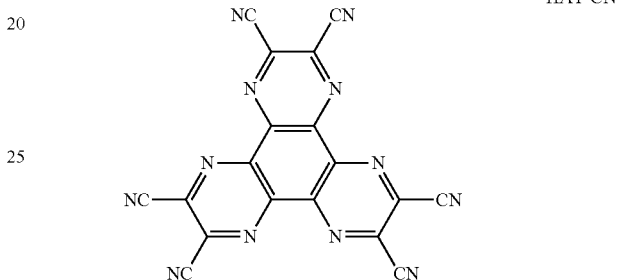

HAT-CN

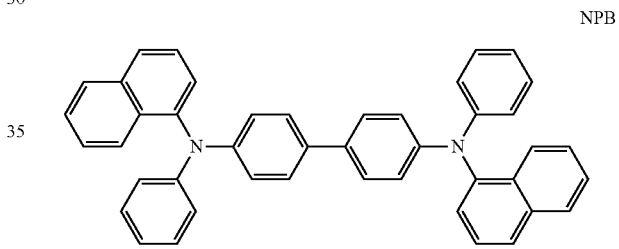

NPB

D1

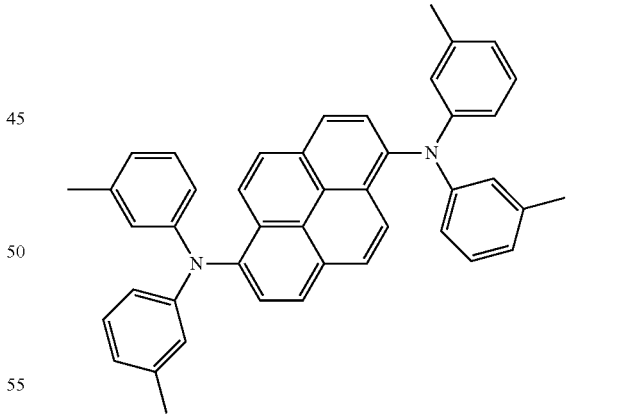

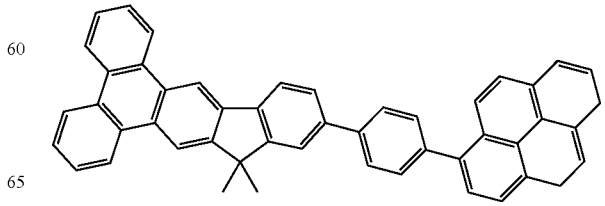

PT-312

PT-313
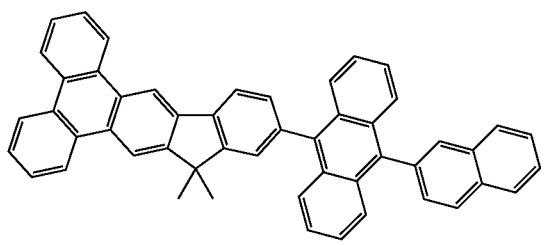
LiQ
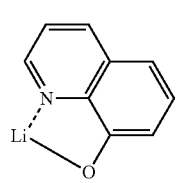
ET1
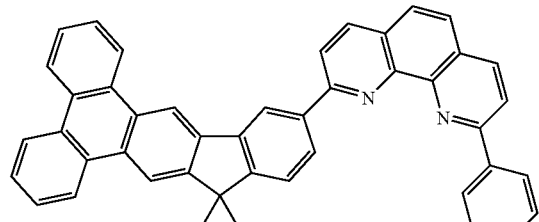
ET2
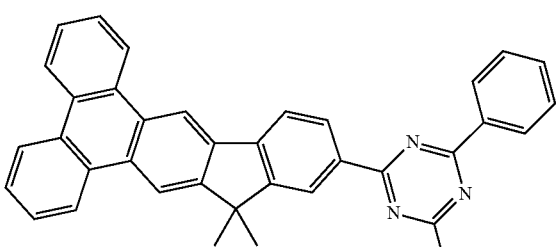
ET3
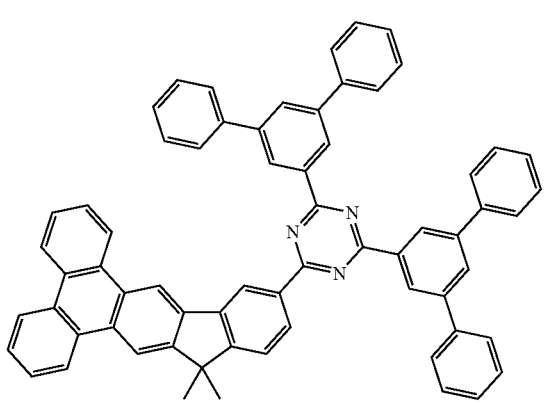
ET4
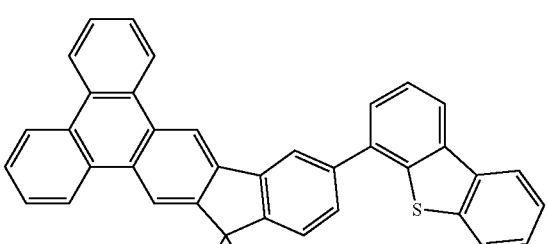
H1
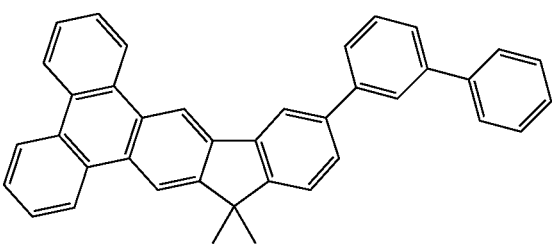
D2
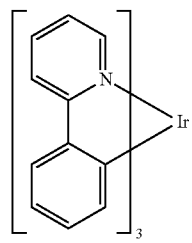
A1
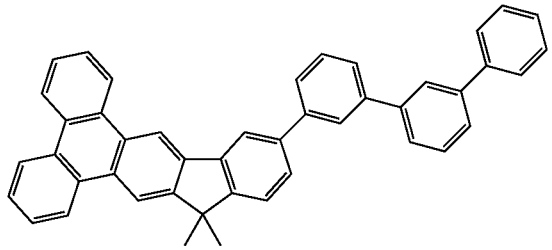
A2

-continued

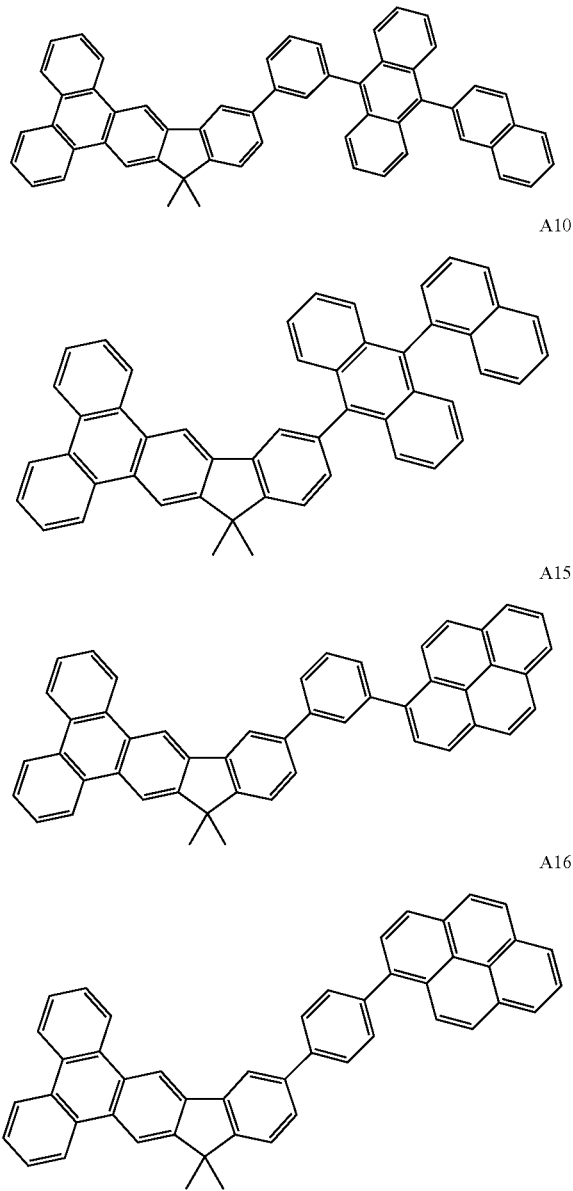

A typical organic EL device consists of low work function metals, such as Al, Mg, Ca, Li and K, as the cathode by thermal evaporation, and the low work function metals can help electrons injecting the electron transporting layer from cathode. In addition, for reducing the electron injection barrier and improving the organic EL device performance, a thin-film electron injecting layer is introduced between the cathode and the electron transporting layer. Conventional materials of electron injecting layer are metal halide or metal oxide with low work function, such as: LiF, LiQ, MgO, or $Li_2O$. On the other hand, after the organic EL device fabrication, EL spectra and CIE coordination are measured by using a PR650 spectra scan spectrometer. Furthermore, the current/voltage, luminescence/voltage and yield/voltage characteristics are taken with a Keithley 2400 programmable voltage-current source. The above-mentioned apparatuses are operated at room temperature (about 25° C.) and under atmospheric pressure.

Example 7

Using a procedure analogous to the above mentioned general method, fluorescent blue-emitting organic EL device having the following device structure I and II was produced (See FIG. 1). Device I: ITO/HAT-CN (20 nm)/NPB (130 nm)/fluorescent host doped 5% D1 (30 nm)/ETM doped 5% Li (35 nm)/Al (160 nm). Device II: ITO/HAT-CN (20 nm)/NPB (130 nm)/fluorescent host doped 5% D1 (30 nm)/ETM co-deposit 50% LiQ (40 nm)/LiQ (1 nm)/Al (160 nm). The I-V-B (at 1000 nits) and half-life time of fluorescent blue-emitting organic EL device testing report as Table 1 and Table 2. The half-life time is defined that the initial luminance of 1000 cd/m² has dropped to half.

TABLE 1

| Fluorescent Host | ETM doped 5% Li | Voltage (V) | Efficiency (cd/A) | CIE(y) | Half-life time (hour) |
|---|---|---|---|---|---|
| PT-312 | ET1 | 5.0 | 3.3 | 0.172 | 330 |
| PT-313 | ET1 | 5.0 | 3.1 | 0.175 | 210 |
| A8 | ET1 | 4.8 | 3.6 | 0.172 | 230 |
| A10 | ET1 | 5.2 | 3.5 | 0.171 | 250 |
| A15 | ET1 | 4.5 | 4.3 | 0.173 | 380 |
| A16 | ET1 | 4.8 | 4.0 | 0.172 | 350 |
| A15 | ET4 | 5.1 | 2.4 | 0.172 | 180 |

TABLE 2

| Fluorescent Host | ETM co-deposit 50% LiQ | Voltage (V) | Efficiency (cd/A) | CIE(y) | Half-life time (hour) |
|---|---|---|---|---|---|
| PT-312 | ET3 | 5.0 | 4.8 | 0.181 | 360 |
| PT-313 | ET3 | 5.1 | 4.5 | 0.180 | 260 |
| A8 | ET3 | 4.8 | 5.0 | 0.181 | 280 |
| A10 | ET3 | 4.8 | 5.1 | 0.182 | 250 |
| A15 | ET3 | 4.5 | 5.2 | 0.179 | 380 |
| A16 | ET3 | 4.5 | 5.2 | 0.180 | 420 |
| A15 | ET2 | 4.3 | 5.0 | 0.181 | 400 |
| A16 | ET2 | 4.6 | 5.4 | 0.182 | 320 |
| A15 | ET4 | 5.8 | 4.2 | 0.180 | 110 |

Example 8

Using a procedure analogous to the above mentioned general method, phosphorescent emitting organic EL device having the following device structures are produced (See FIG. 1.): ITO/HAT-CN (20 nm)/NPB (130 nm)/phosphorescent host (PHhost)+12% D2 (30 nm)/H1 (15 nm)/ET2 co-deposit 50% Li (40 nm)/LiQ (1 nm)/Al (160 nm). The I-V-B (at 1000 nits) and half-life time of phosphorescent emitting organic EL device testing report as Table 3. The half-life time is defined that the initial luminance of 3000 cd/m² has dropped to half.

TABLE 3

| PHhost | HBM | ETM | Voltage (V) | Efficiency (cd/A) | CIE(x, y) | Half-life time (hour) |
|---|---|---|---|---|---|---|
| A1 | H1 | ET3 | 4.5 | 39 | 0.35, 0.54 | 450 |
| A2 | H1 | ET3 | 4.2 | 43 | 0.36, 0.54 | 460 |
| A1 | H1 | ET2 | 4.0 | 38 | 0.36, 0.55 | 550 |
| A2 | H1 | ET2 | 4.3 | 42 | 0.35, 0.56 | 500 |
| A2 | H1 | ET4 | 5.0 | 28 | 0.36, 0.55 | 250 |
| A2 | — | ET2 | 4.3 | 38 | 0.34, 0.56 | 410 |

In the above preferred embodiments for organic EL device test report (see Table 1 to Table 3), we show that with a general formula (I) in the present invention display good performance and more purpose (A1,A2 is used for phosphorescent host) than the prior art of OLED materials US20140131664 A1, US20140175384A1 and US20140209866A1. More specifically, the organic EL device in the present invention to collocate with H1 (hole blocking layer) and ET1, ET2 or ET3 (electron transporting layer) shown lower power consumption, higher efficiency and longer half-life time than the prior art of OLED materials ET4.

To sum up, the present invention discloses a compound which can be used for organic EL device is disclosed. More specifically, an organic EL device employing the compound as fluorescent emitting host, phosphorescent emitting host. The mentioned compound are represented by the following formula (I)

formula(I)

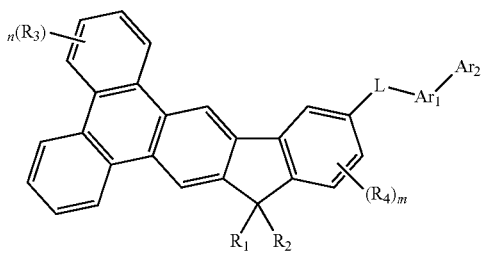

Wherein L represent a single bond, a substituted or unsubstituted divalent arylene group having 6 to 30 ring carbon atoms. $Ar_1$, $Ar_2$ independently selected from the group consisting of a substituted or unsubstituted phenyl group, a substituted or unsubstituted naphthyl group, a substituted or unsubstituted anthracenyl group, a substituted or unsubstituted phenanthrenyl group, a substituted or unsubstituted pyrenyl group, a substituted or unsubstituted chrysenyl group. m represent an integer of 0 to 3. n represent an integer of 0 to 10. $R_1$ to $R_4$ independently selected from the group consisting of a hydrogen atom, a substituted or unsubstituted alkyl group having 1 to 20 carbon atoms, a substituted or unsubstituted aryl group having 6 to 30 carbon atoms, a substituted or unsubstituted aralkyl group having 6 to 30 carbon atoms, a substituted or unsubstituted heteroaryl group having 3 to 30 carbon atoms.

The invention claimed is:

1. A compound with one of the following formulas:

A1

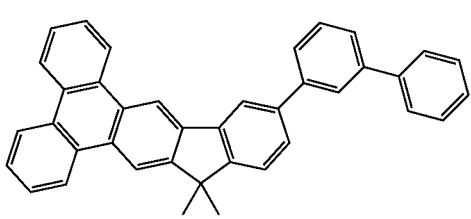

-continued

A2

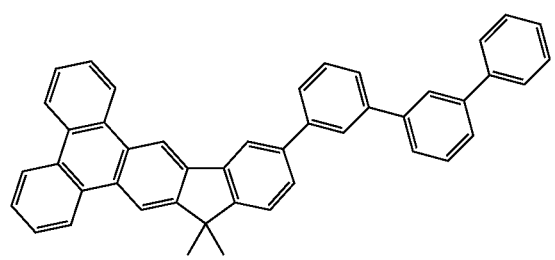

A3

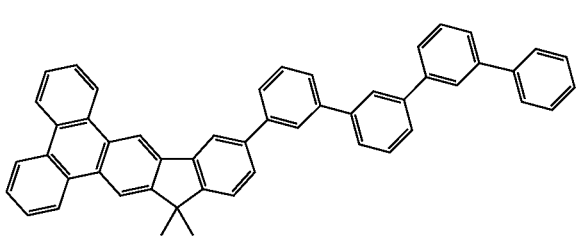

A4

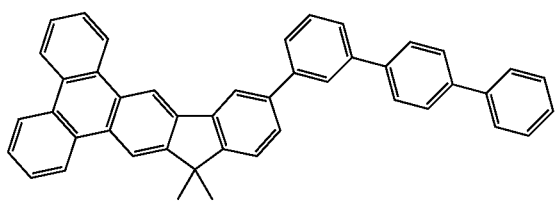

A5

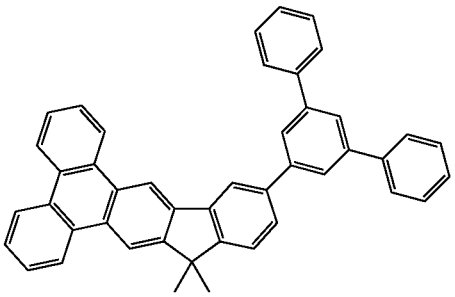

A6

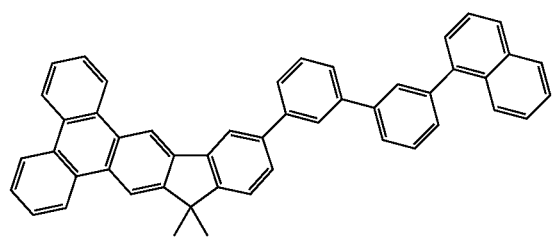

A7

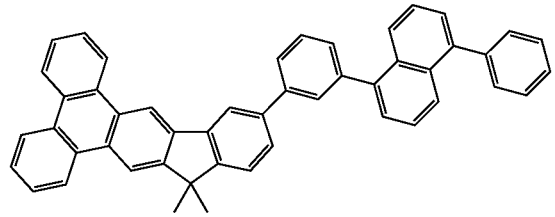

A8
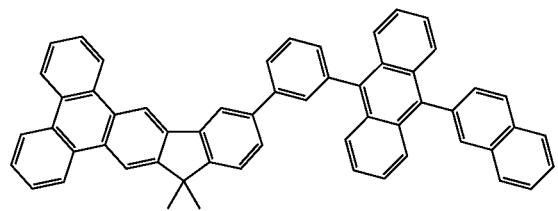
A9
A10
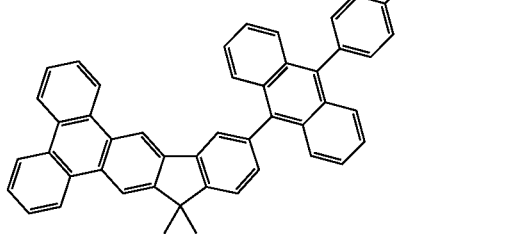
A11
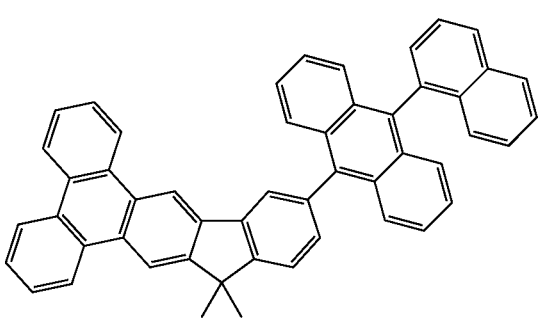
A12
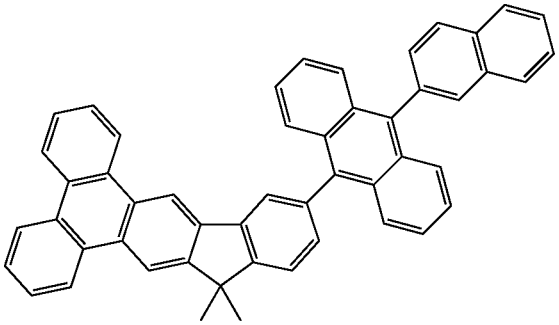
A13
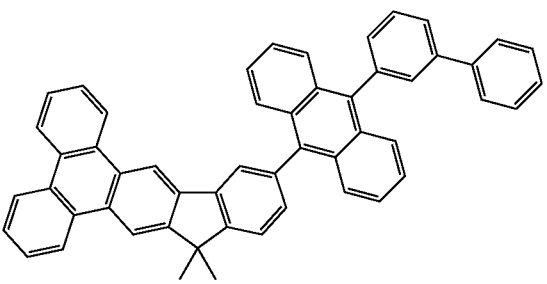
A14
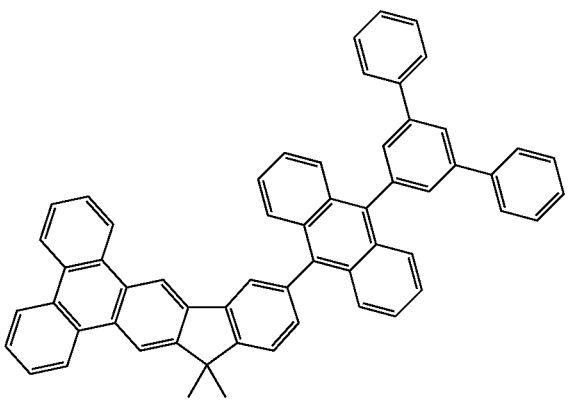
A15
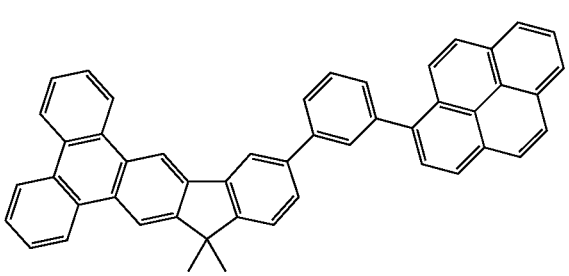
A16
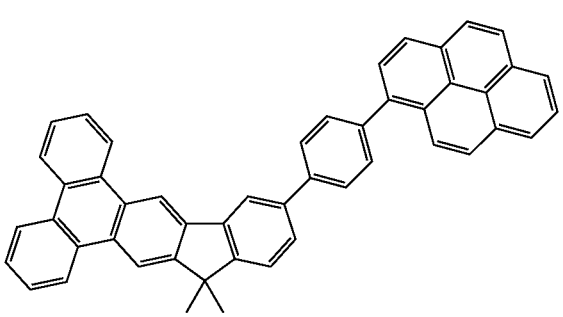
A17
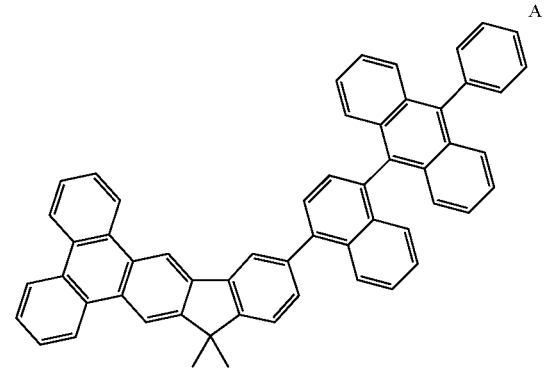

A18

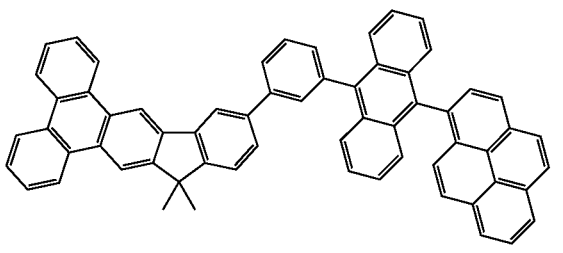

A19

A23

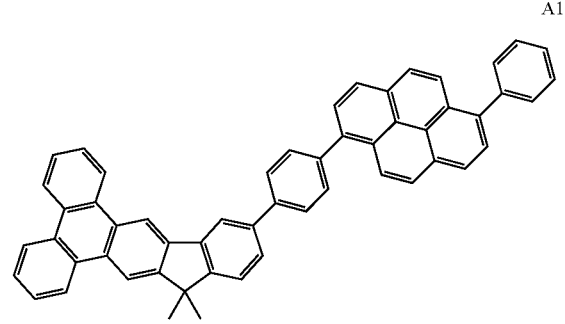

A24

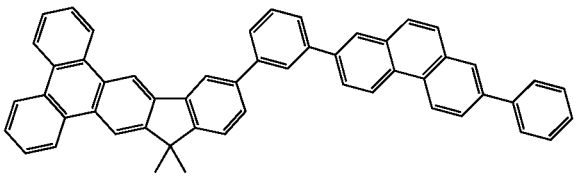

A20

A25

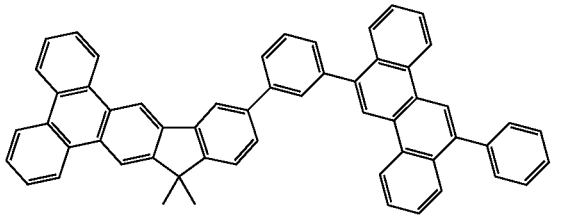

A21

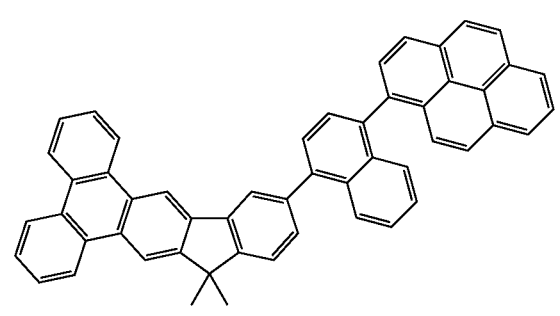

A26

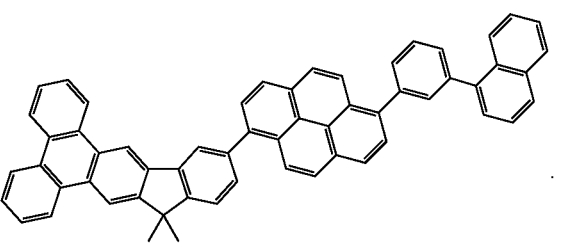

A22

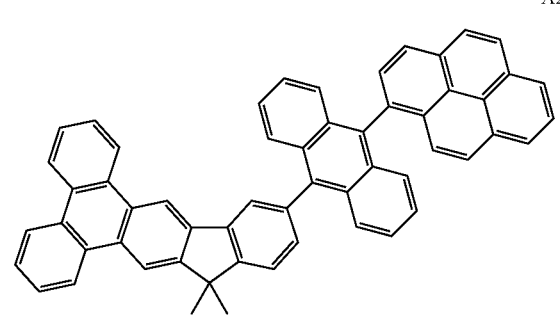

2. A compound comprising a general formula (I) as following:

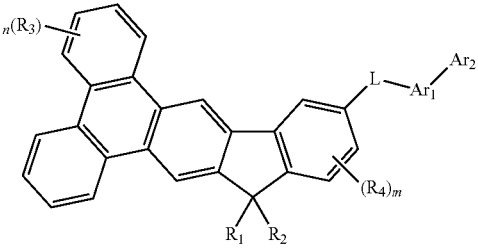

formula(I)

wherein L represents a single bond, or a substituted or unsubstituted divalent arylene group having 6 to 30 ring carbon atoms, $Ar_1$, $Ar_2$ are independently selected from the group consisting of a substituted or unsubstituted phenyl group, a substituted or unsubstituted naphthyl group, a substituted or unsubstituted anthracenyl group, a substituted or unsubstituted phenanthrenyl group, a substituted or unsubstituted pyrenyl group, and a substituted or unsubstituted chrysenyl group, $Ar_1$ is represented as the following:

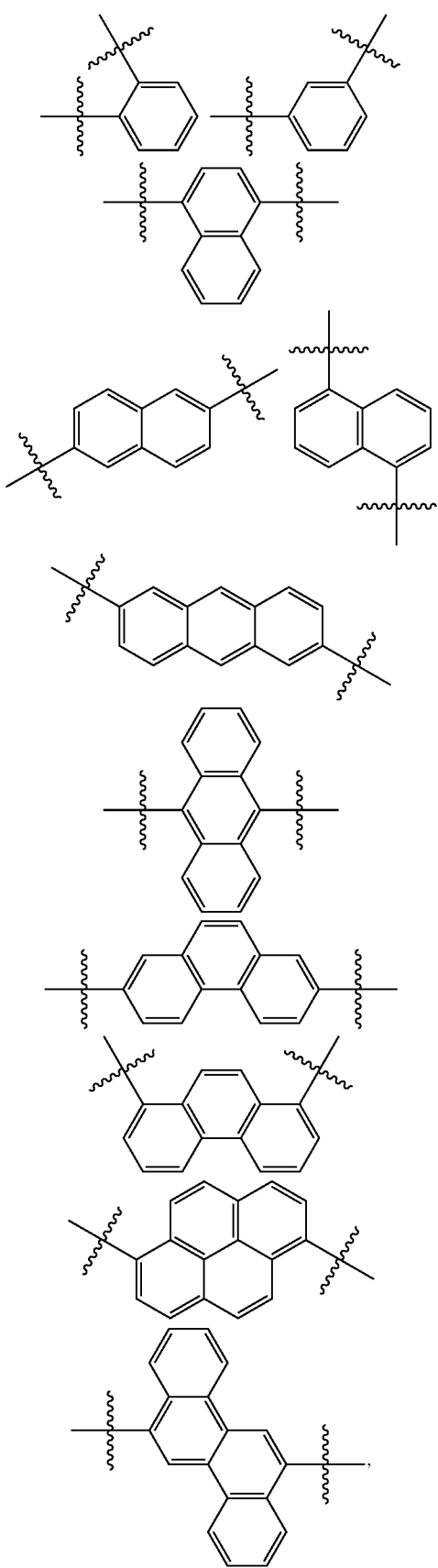
and
Ar$_2$ is represented as the following:
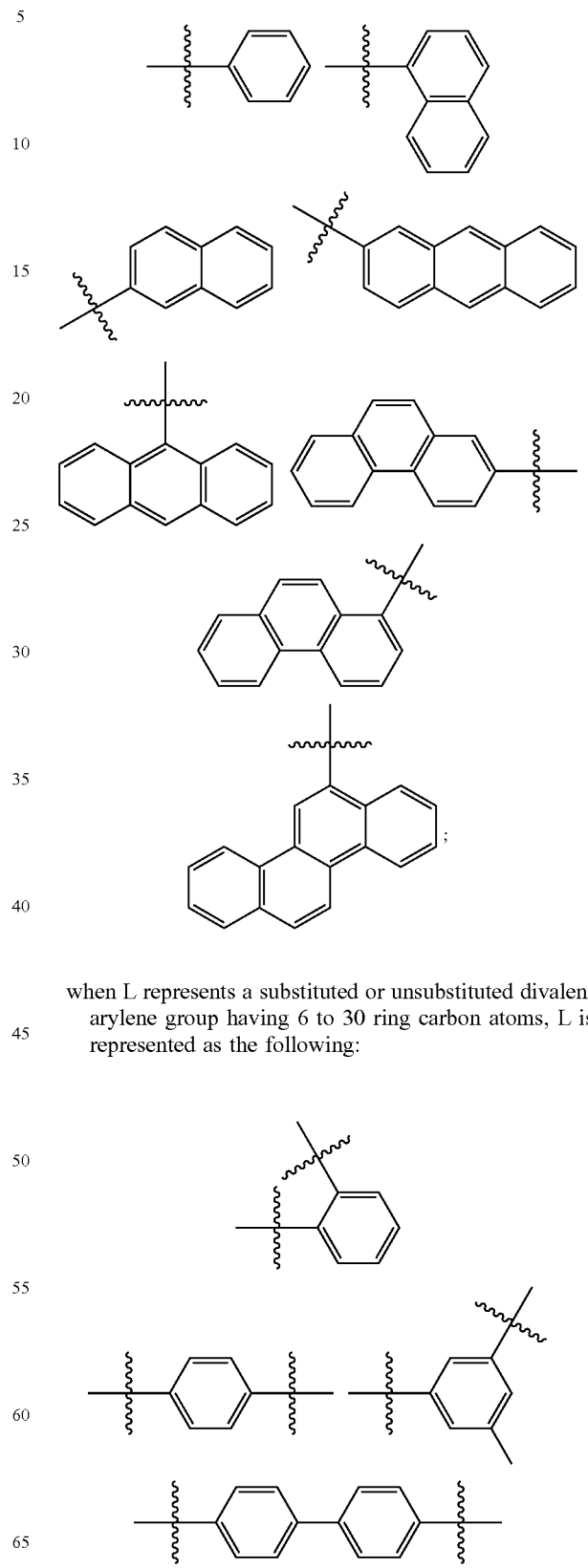
when L represents a substituted or unsubstituted divalent arylene group having 6 to 30 ring carbon atoms, L is represented as the following:

-continued

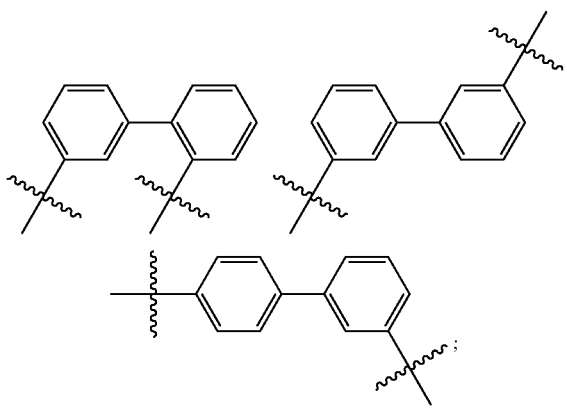

m represents an integer of 0 to 3, n represents an integer of 0 to 10, and $R_1$ to $R_4$ are independently selected from the group consisting of a hydrogen atom, a substituted or unsubstituted alkyl group having 1 to 20 carbon atoms, a substituted or unsubstituted aryl group having 6 to 30 carbon atoms, a substituted or unsubstituted aralkyl group having 6 to 30 carbon atoms, and a substituted or unsubstituted heteroaryl group having 3 to 30 carbon atoms.

3. A organic electroluminescent device comprising a pair of electrodes consisting of a cathode and an anode and between the pair of electrodes comprising at least an emitting layer of the compound with the general formula (I) according to claim 2.

4. The organic electroluminescent device according to claim 3, wherein the emitting layer comprises the compound with a general formula (I).

5. The organic electroluminescent device according to claim 4, wherein the emitting layer comprising the compound with the general formula (I) is a fluorescent host material or phosphorescent host material.

6. The organic electroluminescent device according to claim 4, wherein the emitting layer comprises fluorescent dopant or phosphorescent dopant.

7. The organic electroluminescent device according to claim 6, wherein the phosphorescent dopant comprises iridium (Ir) complexes.

8. The organic electroluminescent device according to claim 4, wherein the emitting layer comprises lithium or 8-hydroxyuinolinolato-lithium.

* * * * *